United States Patent [19]

Clark et al.

[11] Patent Number: 5,128,607
[45] Date of Patent: Jul. 7, 1992

[54] CONSTANT EVENTS FREQUENCY MEASUREMENT AND FAST INVERSE CIRCUIT

[75] Inventors: David W. Clark, Santa Clara; David Chu, Woodside; Alan Davis, San Francisco; Keith M. Ferguson, Saratoga, all of Calif.

[73] Assignee: Hewlett-Packard Company, Palo Alto, Calif.

[21] Appl. No.: 611,242

[22] Filed: Nov. 9, 1990

[51] Int. Cl.[5] .............................................. G01R 23/02
[52] U.S. Cl. .................................. 324/78D; 324/79 D; 377/20
[58] Field of Search .................. 377/20; 328/129.1; 324/78 R, 78 D, 79 D

[56] References Cited

U.S. PATENT DOCUMENTS

| | | | |
|---|---|---|---|
| 3,991,365 | 11/1976 | Takeuchi | 324/78 R |
| 4,257,005 | 3/1981 | Hall | 324/78 R |
| 4,544,884 | 10/1985 | Hayashi | 324/78 R |
| 4,624,005 | 11/1986 | Tachino | 377/20 |
| 4,707,653 | 11/1987 | Wagner | 324/78 R |
| 4,786,861 | 11/1988 | Hulsing | 324/78 R |

Primary Examiner—Gerard R. Strecker
Assistant Examiner—Jose M. Solis
Attorney, Agent, or Firm—James M. Williams

[57] ABSTRACT

A method and apparatus makes rapid frequency measurements by measuring time intervals for a series of blocks of event counts with the number of events in each block held constant. This makes the numerator of the events/time relationship constant so it does not have to be measured, processed or stored. The frequency of the signal is determined by measuring the time interval, then taking the inverse of the measured value and multiplying by the appropriate constant. A fast inverse circuit uses a Taylor series expansion technique implemented in digital circuit, with the slope resolution adjusted for regions of small slope to improve accuracy.

8 Claims, 5 Drawing Sheets

CONSTANT EVENTS FREQUENCY MEASUREMENT AND FAST INVERSE CIRCUIT

FIELD OF THE INVENTION

The invention relates generally to measuring signal attribute data, and in particular to making frequency measurements for a high frequency signal. One aspect of the invention is a method of measuring frequency by measuring the time interval for a constant number of input signal cycles or events. Another aspect of the invention is a fast inverse circuit for transforming time interval measurements into values that represent frequency.

BACKGROUND OF THE INVENTION

Precision frequency counters typically include two counters, a time counter to accumulate events from a stable clock, and an event counter to accumulate events from an input signal. Dividing the number of events in the event counter by the result in the time counter provides the average frequency of the input signal.

The two counters are started and stopped by a signal called a gate. If the gate is synchronized with the clock, the gate time is controlled exactly and the number of input signal events is counted with some uncertainty (plus or minus one event). If the gate is synchronized with the input signal, the number of input signal events is counted exactly and the elapsed time is counted with some uncertainty (plus or minus one clock period). This latter method is called reciprocal counting.

Because the plus or minus one event count uncertainty gives relatively poor frequency resolution, virtually all modern precision frequency counters use the reciprocal counting method. Increased accuracy can be gained by averaging over more than one input signal event.

However, division is an inherently slow operation. In the digital circuits used in most modern instruments, division requires many processing cycles or a very large amount of circuitry because the computation of each output bit uses a carry through many bits of the intermediate results of the previous output bit.

One approach to avoiding division is to measure the period between successive pulses and generate the inverse of the period to produce the frequency. This approach is disclosed in U.S. Pat. No. 4,707,653 (Wagner). Wagner uses a PROM which includes a lookup table to provide the inverse of the period. However, Wagner does not address making measurements over multiple cycles, which is necessary to produce high precision frequency measurements. Also, because Wagner's device measures on every input event, it is limited to relatively low frequency applications. Finally, the simple look up table limits the accuracy provided.

The limits imposed by division for measurements on multiple cycles made it difficult or impossible to make successive frequency measurements as rapidly as desired. Making more rapid frequency measurements would allow triggering a frequency versus time measurement on a frequency transition, making and displaying nearly real time frequency measurements of a frequency modulated or frequency agile signal, or producing histograms of frequency distribution of such signals. Another application is making a precision, wideband, programmable frequency to voltage converter.

Another application for making rapid frequency measurements is in an instrument for providing continuous time interval measurements on a signal. Continuous time interval measurements make it simpler to study dynamic frequency behavior of a signal: frequency drift over time of an oscillator, the frequency hopping performance of an agile transmitter, chirp linearity and phase switching in radar systems. Continuous time interval measurements on a signal provide a way to analyze characteristics of the signal in the modulation domain, i.e., the behavior of the frequency or phase of the signal versus time. An example of an instrument that generates this type of time stamp and continuous time interval data is described in "Frequency and Time Interval Analyzer Measurement Hardware", Paul S. Stephenson, Hewlett-Packard Journal, Vol. 40, No. 1, February, 1989.

SUMMARY OF THE INVENTION

One aspect of the invention is a method and apparatus for making rapid frequency measurements by measuring time intervals for a series of blocks of event counts with the number of events in each block held constant. This makes the numerator of the events/time relationship constant so it does not have to be measured, processed or stored. The frequency of the signal is determined by measuring the time interval, then taking the inverse of the measured value and multiplying by the appropriate constant.

Another aspect of the invention is a fast inverse circuit. The circuit uses a Taylor series expansion technique implemented in digital circuitry, with the slope resolution adjusted for regions of small slope to improve accuracy.

DESCRIPTION OF A PREFERRED EMBODIMENT

Figure 1:
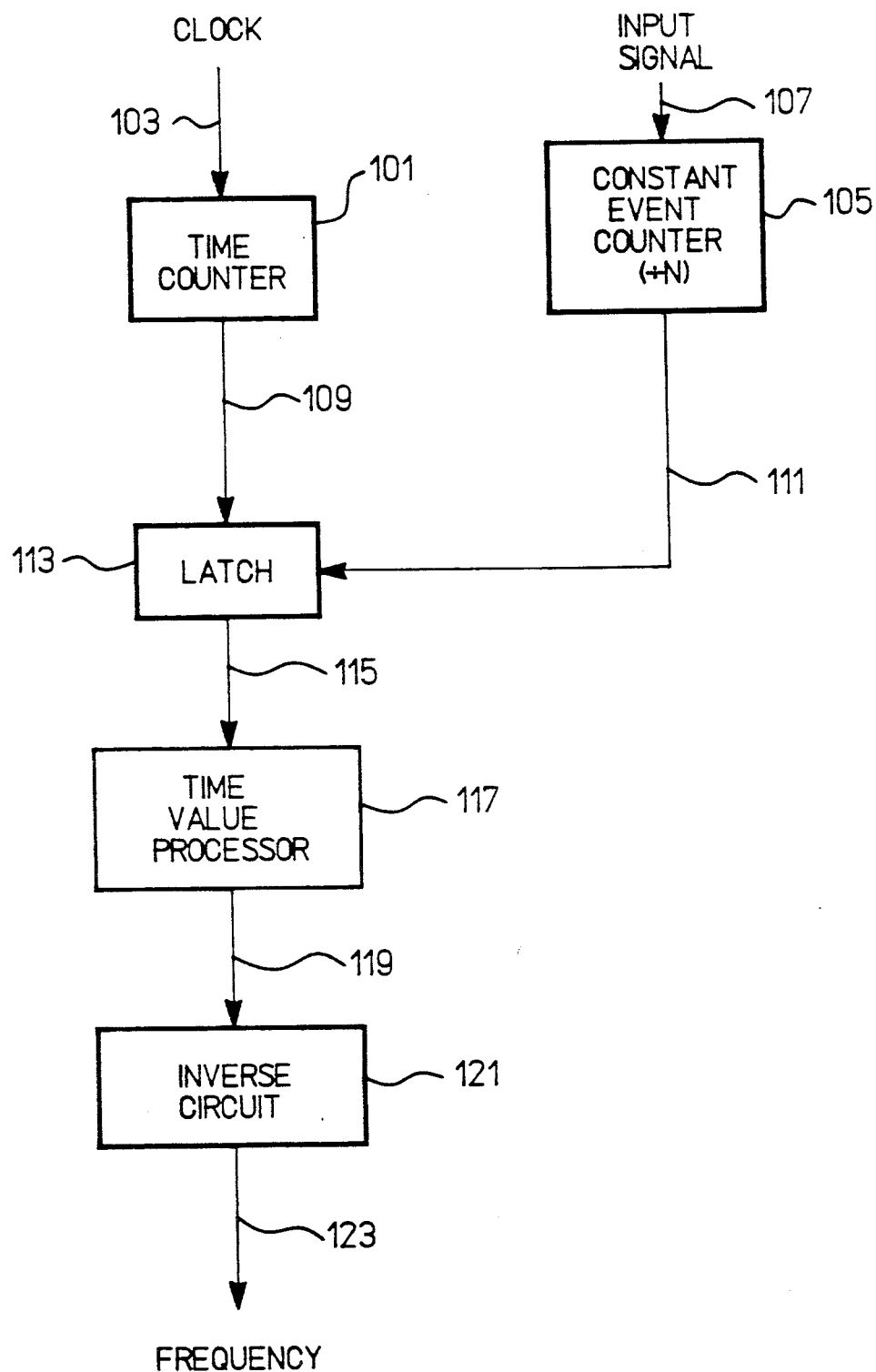
FIG. 1 shows a high level block diagram of a frequency counter using the constant event measurement method and the fast inverse circuit of the invention.

FIG. 1 shows a high level block diagram of a frequency counter using the constant event measurement method and the fast inverse circuit of the invention. A time counter 101 receives a clock signal on input line 103 from a stable, high frequency clock and produces an output of the accumulated count on line 109. An input signal whose frequency is to be measured is applied on line 107 to a constant event counter 105, described in more detail below, that produces an output pulse on line 111 every N input signal events. The constant event counter 105 is programmable so that N can be varied.

The count data on line 109 is applied to the data input of latch 113 and the pulses on line 111 are applied to the enable input of latch 113. Thus, at each output pulse from the constant event counter 105, the current value in the time counter 101 is stored in latch 113. The data output of latch 113 on line 115 is a series of time values corresponding to the time of occurrence of sequential blocks of N input signal events.

The series of time values is applied to a time value processor 117. The time value processor produces a series of time interval values on line 119, representing the difference between sets of time values. The time values can be processed in a variety of ways, some well known, to produce time interval values. The details of the processing methods are beyond the scope of this invention. One simple way to process the time values, that is sufficient to demonstrate the operation of the invention, is to take the difference between successive time values to yield a series of time intervals.

The time interval values on line 119 are applied to inverse circuit 121, which takes the inverse of the values to produce a series of corresponding frequency values on line 123. The operation of the inverse circuit is explained in more detail below.

The frequency output values on line 123 can be displayed or stored for postprocessing. Because they are derived from constant event measurements, the time interval signals on line 119 can be applied to triggering circuits with the appropriate time value limits to allow triggering on a desired frequency.

Figure 2:
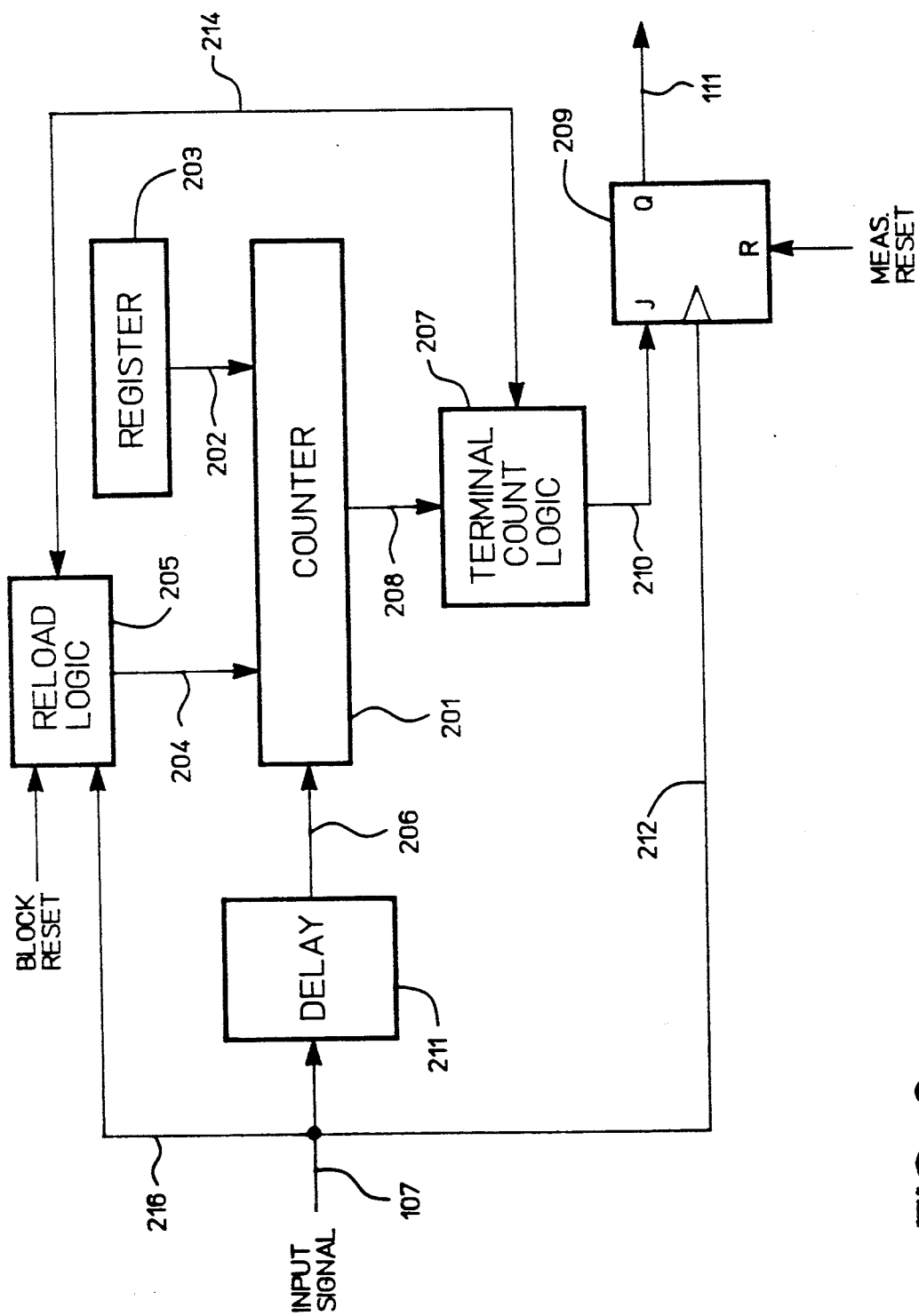
FIG. 2 shows a more detailed block diagram of the constant event counter 105 in FIG. 1.

FIG. 2 shows a more detailed block diagram of the constant event counter 105 in FIG. 1. Counter 105 is a programmable count down counter that can be reloaded with an initial value when it reaches its terminal count without skipping any cycles. Because it is used to arm for measuring the same signal being counted, it must produce an output in time for a measurement on the immediately following edge. For a 100 MHz input signal, this will occur as soon as 10 ns after the edge initiating the output.

Counter 201 is an 8 bit down counter. This counter can be implemented in a variety of ways, with one preferred circuit being eight flip flops with the flip flops for the two least significant bits connected in a synchronous configuration and the remaining flip flops connected in a ripple through configuration. The counter is asynchronously loaded with an initial state from register 203 via line 202, on the occurrence of a signal from a reload logic circuit 205 on line 204. Register 203 can be loaded with the desired preset initial value to provide an output every N input signal events.

The input signal to be measured, on line 107, is applied to counter 201 on line 206 through a delay 211, described below. The output of counter 201 is applied to terminal count logic 207 on line 208.

A latch output signal of terminal count logic 207 on line 210 is applied to the J input of output latch flip flop 209. Flip flop 209 is clocked by the input signal via line 212. Thus, on the next input signal edge after the latch signal is applied, flip flop 209 produces an output signal on line 111 that is applied to the latch 113 as described above. Latch flip flop 209 is reset at the start of each measurement.

A reload output signal of terminal count logic 207 is applied to reload logic 205 via line 214 to enable reloading when counter 201 reaches its terminal count. The input signal is applied to reload logic 205 via line 216. Reload logic 205 is reset at the start of each measurement block.

Delay 211 delays the input signal to the counter 201, to provide time for the counter to recover from the reload. However, this delay also subtracts from the setup time for the output latch flip flop 209. Thus, delay 211 must be long enough to allow the terminal logic and the reload logic, triggered by the undelayed input event edge, to reload the counter 201 before the following delayed input event arrives on line 206. The delay must be short enough so the counter is not reloaded and starting to count when the delayed event edge arrives on line 206. The delay must be short enough so the latch output signal on line 210 reaches the flip flop 209 in time for it to be clocked by following undelayed input event edge on line 212.

Figure 3:
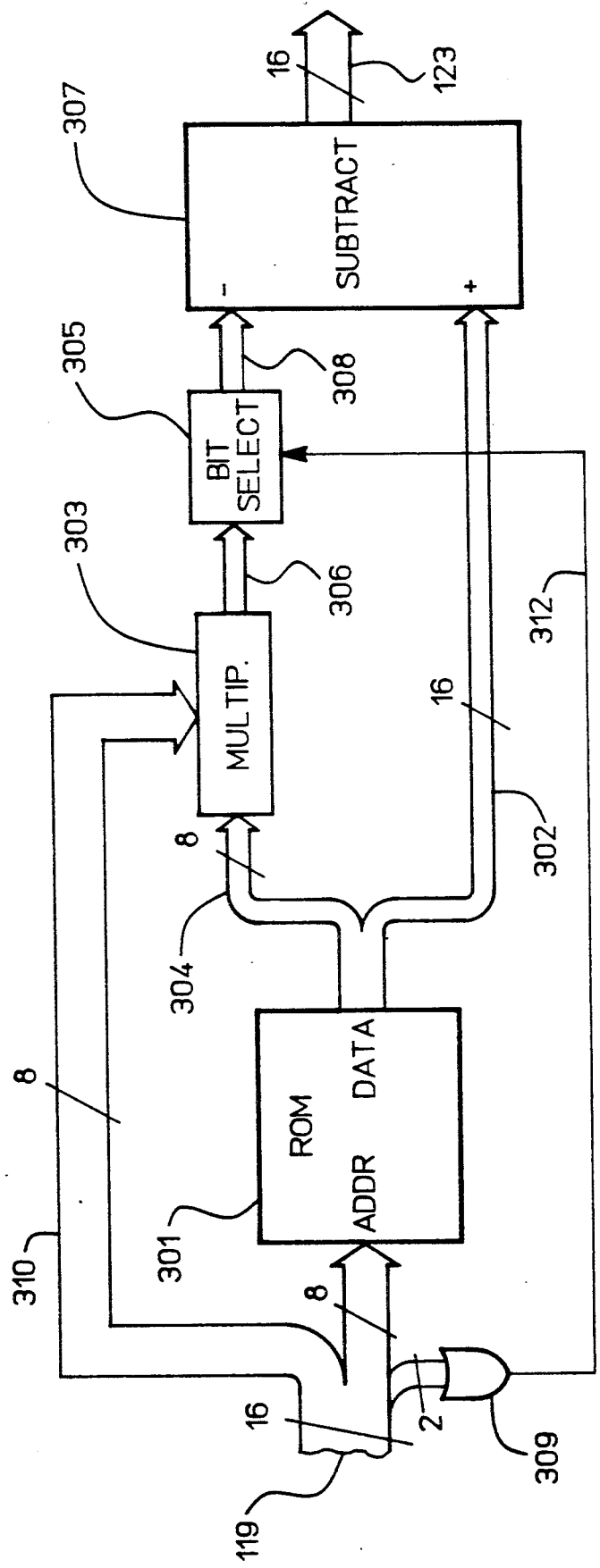
FIG. 3 shows a more detailed schematic block diagram of the inverse circuit 121 in FIG. 1.

FIG. 3 shows a more detailed schematic block diagram of the inverse circuit 121 in FIG. 1. The circuit includes a read only memory (ROM) 301, a multiplier 303, a bit field selector multiplexer 305 an a subtractor 307. The input to the inverse circuit 121 are the time interval values on line 119. In the embodiment described, these are 16 bit binary words. The inverse circuit takes the inverse of the input interval values by approximating a Taylor series expansion.

A Taylor series expansion of 1/X from a nearby point Xo is:

$$1/X = 1/Xo - (X - Xo)/Xo^2 + \ldots$$

This is an infinite series, but the higher order terms rapidly approach zero, particularly if Xo is close to X.

For a binary word X, Xo can be the more significant bits of X (with the less significant bits assumed to be zero) and (X−Xo) can be the less significant bits. For example, if X is a 16 bit binary number, Xo is the 8 most significant bits and (X−Xo) is the 8 least significant bits. Thus subtraction is not needed to produce the (X−Xo) term used in the expansion.

The two most significant bits of the input are applied to an or gate 309, and the output is applied to the bit field select multiplexer 305, to control its operation as explained below.

The eight most significant bits of the input value (representing Xo) form the address applied to ROM 301. ROM 301 is a 256 word by 24 bit memory. ROM 301 operates as a lookup table with two data outputs, a 16 bit word offset representing the inverse of Xo (1/Xo), and an 8 bit word slope representing $1/Xo^2$. The offset is applied to the subtractor 307 on line 302 and the 8 bit slope is applied to multiplier 303 on line 304.

Multiplier 303 also receives the 8 least significant bits of the input value (representing X−Xo) and multiplies this input by the 8 bit slope ($1/Xo^2$) from the ROM 301, producing a 16 bit output representing the second term of the Taylor series expansion, on line 306. The result on line 306 is adjusted by the bit select field as described below, and applied to the subtractor via line 308. Subtractor 308 subtracts the second term value on line 308 from the first term offset value on line 302 to produce a final 16 bit output value that represents the inverse (1/X) of the 16 bit time interval input value (X).

Without the adjustment function that the bit field selector enables the circuit to perform, the circuit would have about 8 bit accuracy for a 16 bit input. The adjustment function and a small reduction of the offset values stored in ROM 301 from the actual values improves the accuracy to about 12-13 bits.

First, the sum of the higher order Taylor expansion terms is always positive, so by reducing the values for the offset stored in ROM 301, the average error can be reduced. In effect the piecewise linear approximation is adjusted to more closely overlay the actual 1/X function curve.

Second, the magnitude of the slope ($1/Xo^2$) decreases very rapidly with increasing Xo, so over most of the range the second term result would be limited by slope quantization. This is avoided by storing 16 times the slope in the addresses for the upper ¾ of the range of the ROM 301, and using a different set of bits (shifted by 4) out of the multiplier 303 to apply to the subtractor 307. The shifting function is accomplished by the bit field select multiplexer 305, controlled by the ORed 2 most significant bits of the time value input on line 312.

Figure 4A:
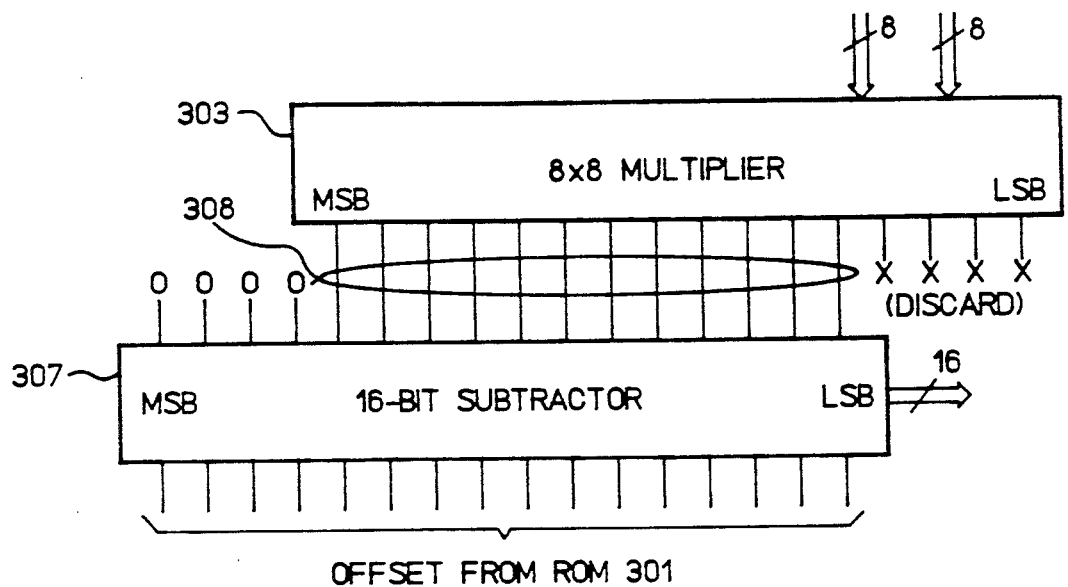
FIG. 4A illustrates the combination of bits sent to the subtractor 307 if X is in the lower ¼ of the input range.
Figure 4B:
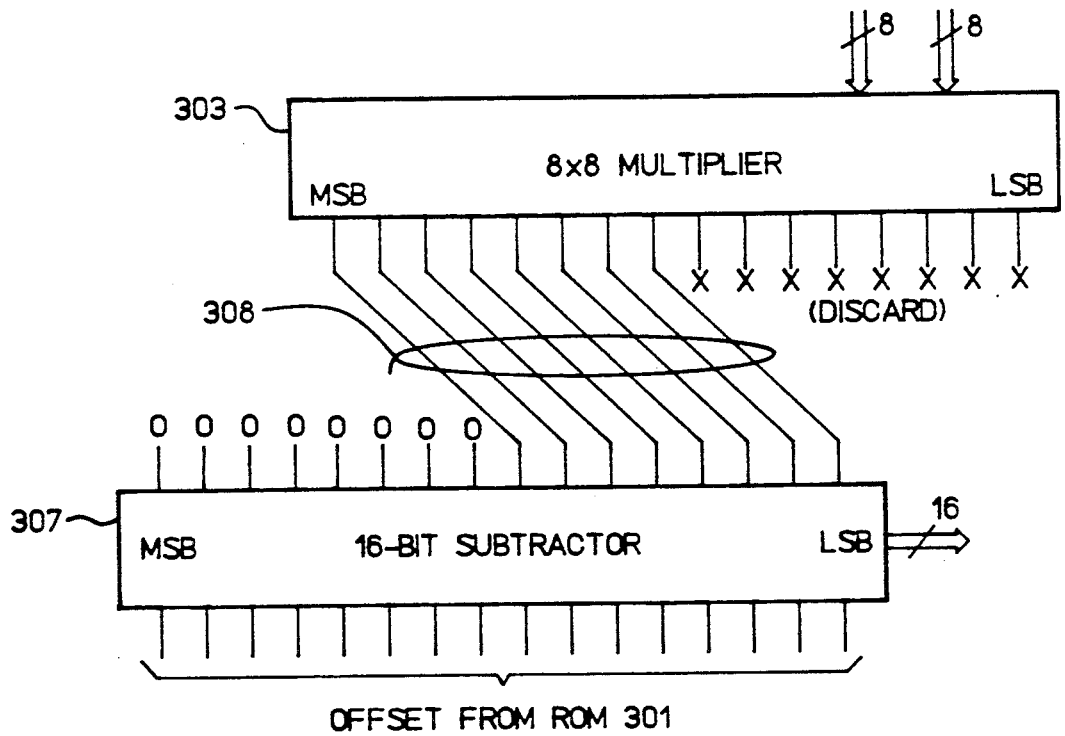
FIG. 4B illustrates the combination of bits sent to the subtractor 307 if X is in the upper ¾ of the input range.

The operation of the bit field select multiplexer is illustrated in FIGS. 4A and 4B. FIG. 4A illustrates the combination of bits sent to the subtractor 307 if X is in the lower ¼ of the input range. This is indicated when the two most significant bits of the input value on line 119 are both 0, and the ORed value on line 312 is thus 0. Of the 16 bits produced by multiplier 303, the 4 least significant bits are discarded and the 12 most significant bits are applied to the 12 least significant bits of the subtractor.

FIG. 4B illustrates the combination of bits sent to the subtractor 307 if X is in the upper ¼ of the input range. This is indicated when either or both of the two most significant bits of the input value on line 119 are 1, and the ORed value on line 312 is thus 1. Of the 16 bits produced by multiplier 303, the 8 least significant bits are discarded and the 8 most significant bits are applied to the 8 least significant bits of the subtractor. In this case the multiplier output is shifted down by 4 bits to adjust for the 16 times slope values stored in the ROM table.

Figure 5:
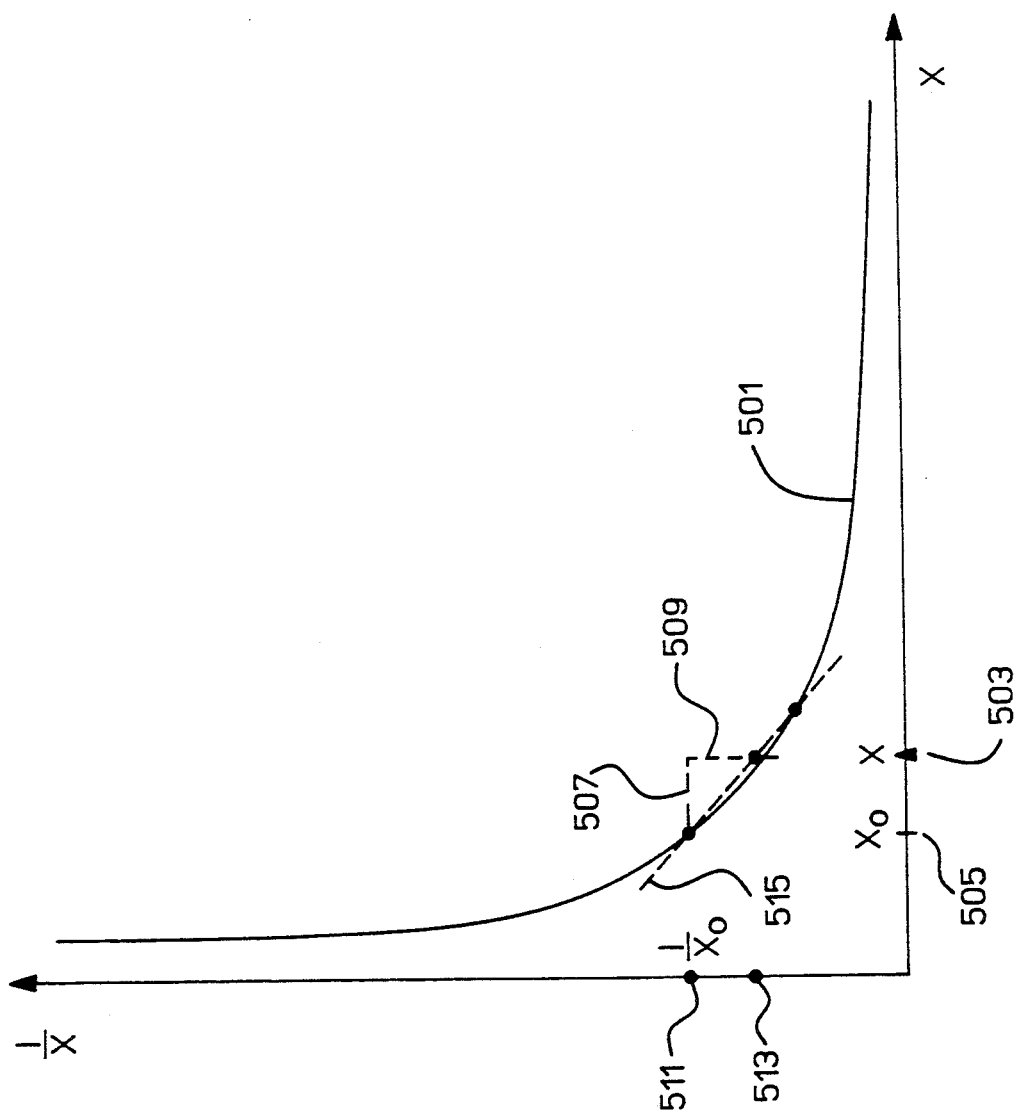
FIG. 5 graphically illustrates the operation of the inverse circuit 121.

FIG. 5 graphically illustrates the operation of the inverse circuit 121. The horizontal axis is the input value X, and the vertical axis is the output value $1/X$. The curve 501 shows the $1/X$ relationship. Point 503 represents a particular (16 bits) input value X. Point 505 represents the Xo (8 bits) applied as the address for ROM 301. The hash marks on the horizontal axis illustrate the quantization limit of the 8 bit approximation. Point 511 represents the approximation offset value $1/Xo$ stored (16 bits) in ROM 301, and applied to subtractor 307. The length of dashed line segment 507 indicates the difference $X-Xo$ (8 bits), sent to multiplier 303. The slope of dashed line segment 515 indicates the slope value ($1/Xo^2$) (8 bits) stored in ROM 301 and also sent to multiplier 303. The length of dashed line segment 509 indicates the output of multiplier 303, the second Taylor series term $(X-Xo)/Xo^2$, as it is applied to subtractor 307. Finally, point 513 on the vertical axis represents the output (16 bits) of subtractor 307, approximating $1/X$.

While there have been shown and described what are at present considered the preferred embodiments of the present invention, it will be obvious to those skilled in the art that various changes and modifications may be made therein without departing from the scope of the invention as defined by the appended claims.

I claim:

1. A frequency counter for making rapid measurements of the frequency of an input signal, comprising:
    a source of clock signals;
    a time counter connected to the source of clock signals for counting the clock signal events to produce a time count output;
    a constant event counter connected to the input signal for producing a latch enable output signal every N input signal events, where N is an integer greater than 1;
    a latch connected to the time count output and to the latch enable output for latching the time count output on the occurrence of the latch enable output, to produce a time value output;
    a time value processor connected to the time value output for producing a series of time interval output signals representing the difference between successive sets of time values; and
    an inverse circuit connected to the time interval output for producing a frequency value output for each of the time interval input signals by using a Taylor series expansion technique with the slope resolution adjusted for regions of small slope to improve accuracy.

2. The frequency counter of claim 1 wherein the inverse circuit comprises:
    memory connected to selected more significant bits of the time interval output for producing an offset output representing the first term of a Taylor series expansion, and for producing a slope output with the slope output adjusted for regions of small slope;
    a multiplier connected to selected less significant bits of the time interval output and to the slope output, for producing a second term output representing the second term of a Taylor series expansion;
    bit select means connected to the second term output, and to selected significant bits of the time interval output, for selecting the upper or lower bits of the second term output in response to the state of the selected bits of the time interval output and producing an adjusted second term output;
    means connected to the adjusted second term output and to the offset output, for subtracting the adjusted second term output from the offset output to produce the frequency value output.

3. A frequency counter for making rapid measurements of the frequency of an input signal, without skipping any cycles of the input signal between measurements, comprising:
    a source of clock signals;
    a time counter connected to the source of clock signals for counting the clock signal events to produce a time count output;
    a constant event counter connected to the input signal for producing a latch enable output signal every N input signal events, where N is an integer greater than 1 without skipping any input signal cycles, comprising,
        reload logic connected to the input signal and to terminal count logic for producing a reload signal;
        a reloadable count down counter connected to the input signal via a delay element and to the reload signal, for reloading the counter with an initial value when the counter reaches a terminal count, for producing a count output;
        terminal count logic connected to the count output, for producing a latch output signal, and for producing a reload output signal when the counter reaches a terminal count; and
        output logic connected to the input signal and to the latch output signal, for producing a latch enable output on the next edge of the input signal following the latch output signal;
    a latch connected to the time count output and to the latch enable output for latching the time count output on the occurrence of the latch enable output, to produce a time value output;

a time value processor connected to the time value output for producing a series of time interval output signals representing the difference between successive sets of time values; and an inverse circuit connected to the time interval output for producing a frequency value output for each of the time interval input signals.

4. The frequency counter of claim 3 wherein the inverse circuit produces the frequency value output by using a Taylor series expansion technique with the slope resolution adjusted for regions of small slope to improve accuracy.

5. The frequency counter of claim 4 wherein the inverse circuit comprises:

memory connected to selected more significant bits of the time interval output for producing an offset output representing the first term of a Taylor series expansion, and for producing a slope output with the slope output adjusted for regions of small slope;

a multiplier connected to selected less significant bits of the time interval output and to the slope output, for producing a second term output representing the second term of a Taylor series expansion;

bit select means connected to the second term output, and to selected significant bits of the time interval output, for selecting the upper or lower bits of the second term output in response to the state of the selected bits of the time interval output and producing an adjusted second term output;

means connected to the adjusted second term output and to the offset output, for subtracting the adjusting second term output from the offset output to produce the frequency value output.

6. A frequency counter for making a series of measurements of the frequency of an input signal without skipping any cycles of the input signal between measurements, comprising:

a source of clock signals;

a time counter connected to the source of clock signals for counting the clock signal events to produce a time count output;

a constant event counter connected to the input signal for producing a latch enable output signal every N input signal events, where N is an integer greater than 1, without skipping any input signal cycles, comprising, a reloadable counter and logic means for reloading the reloadable counter to an intitial value when the reloadable counter reaches a terminal count, but before the next input signal event arrives at the reloadable counter, and for producing a latch enable ouput before the input signal event following the input signal event that produced the terminal count;

a latch connected to the time count output and to the latch enable output for latching the time count output on the occurrence of the latch enable output, to produce a time value output;

a time value processor connected to the time value ouput for producing a series of time interval output signals representing the difference between successive sets of time values; and an inverse circuit connected to the time interval output for producing a frequency value output for each of the time interval input signals.

7. The frequency counter of claim 6 wherein the inverse circuit produces the frequency value output by using a Taylor series expansion technique with the slope resolution adjusted for regions of small slope to improve accuracy.

8. The frequency counter of claim 6 wherein the inverse circuit comprises:

memory connected to selected more significant bits of the time interval output for producing an offset output representing the first term of a Taylor series expansion, and for producing a slope output with the slope output adjusted for regions of small slope;

a multiplier connected to selected less significant bits of the time interval output and to the slope output, for producing a second term output representing the second term of a Taylor series expansion;

bit select means connected to the second term output, and to selected significant bits of the time interval output, for selecting the upper or lower bits of the second term output in response to the state of the selected bits of the time interval output and producing an adjusted second term output;

means connected to the adjusted second term output and to the offset output, for subtracting the adjusted second term output from the offset output to produce the frequency value output.

* * * * *